US009194924B2

United States Patent
Kundner et al.

(10) Patent No.: US 9,194,924 B2
(45) Date of Patent: Nov. 24, 2015

(54) MRT LOCAL COIL

(75) Inventors: Thomas Kundner, Buckenhof (DE); Jörg Rothard, Litzendorf (DE)

(73) Assignee: Siemens Aktiengesellschaft, München (DE)

( * ) Notice: Subject to any disclaimer, the term of this patent is extended or adjusted under 35 U.S.C. 154(b) by 677 days.

(21) Appl. No.: 13/554,887

(22) Filed: Jul. 20, 2012

(65) Prior Publication Data

US 2013/0021035 A1 Jan. 24, 2013

(30) Foreign Application Priority Data

Jul. 21, 2011 (DE) .......................... 10 2011 079 564

(51) Int. Cl.
G01R 33/3415 (2006.01)
G01R 33/34 (2006.01)

(52) U.S. Cl.
CPC ...... G01R 33/3415 (2013.01); G01R 33/34084 (2013.01)

(58) Field of Classification Search
CPC ...................... G01R 33/3415; G01R 33/34084
See application file for complete search history.

(56) References Cited

U.S. PATENT DOCUMENTS

| | | | |
|---|---|---|---|
| 5,184,076 A * | 2/1993 | Ehnholm ....................... 324/318 |
| 6,297,636 B1 * | 10/2001 | Shimo et al. ................... 324/318 |
| 6,496,006 B1 * | 12/2002 | Vrijheid ....................... 324/318 |
| 6,900,637 B1 | 5/2005 | Seeber | |
| 6,943,551 B2 | 9/2005 | Eberler et al. | |
| 7,123,010 B2 * | 10/2006 | Krockel ......................... 324/318 |
| 7,331,698 B2 * | 2/2008 | Gosswein et al. ............. 362/572 |
| 7,385,399 B2 * | 6/2008 | Deimling et al. ............. 324/318 |
| 7,508,212 B2 * | 3/2009 | Fain et al. ..................... 324/318 |
| 7,684,427 B2 * | 3/2010 | Krockel ........................ 370/438 |
| 7,714,581 B2 * | 5/2010 | Erickson et al. .............. 324/322 |
| 7,834,626 B2 * | 11/2010 | Renz ............................ 324/318 |
| 7,915,892 B2 * | 3/2011 | Okamoto ...................... 324/318 |
| 8,129,992 B2 * | 3/2012 | Cork et al. .................... 324/318 |
| 8,148,986 B2 * | 4/2012 | Driesel et al. ................. 324/318 |
| 8,427,158 B2 * | 4/2013 | Huish et al. ................... 324/318 |
| 8,436,614 B2 * | 5/2013 | Biber et al. ................... 324/318 |
| 8,497,682 B2 * | 7/2013 | Huish et al. ................... 324/318 |
| 2009/0009172 A1 | 1/2009 | Feld et al. | |

FOREIGN PATENT DOCUMENTS

| | | |
|---|---|---|
| DE | 103 14 215 B4 | 11/2006 |
| DE | 10 2007 030 629 A1 | 1/2009 |
| JP | 2001137211 A | 5/2001 |

OTHER PUBLICATIONS

German Office Action dated May 2, 2012 for corresponding German Patent Application No. DE 10 2011 079 564.2 with English translation.

* cited by examiner

*Primary Examiner* — Dixomara Vargas
(74) *Attorney, Agent, or Firm* — Lempia Summerfield Katz LLC

(57) ABSTRACT

A local coil for a magnetic resonance tomography device includes an elastic antenna support part with several antennas and an electronic part with electronic components connected to the antennas via supply lines. At least one part of the electronic part is located outside of the antenna support part.

27 Claims, 3 Drawing Sheets

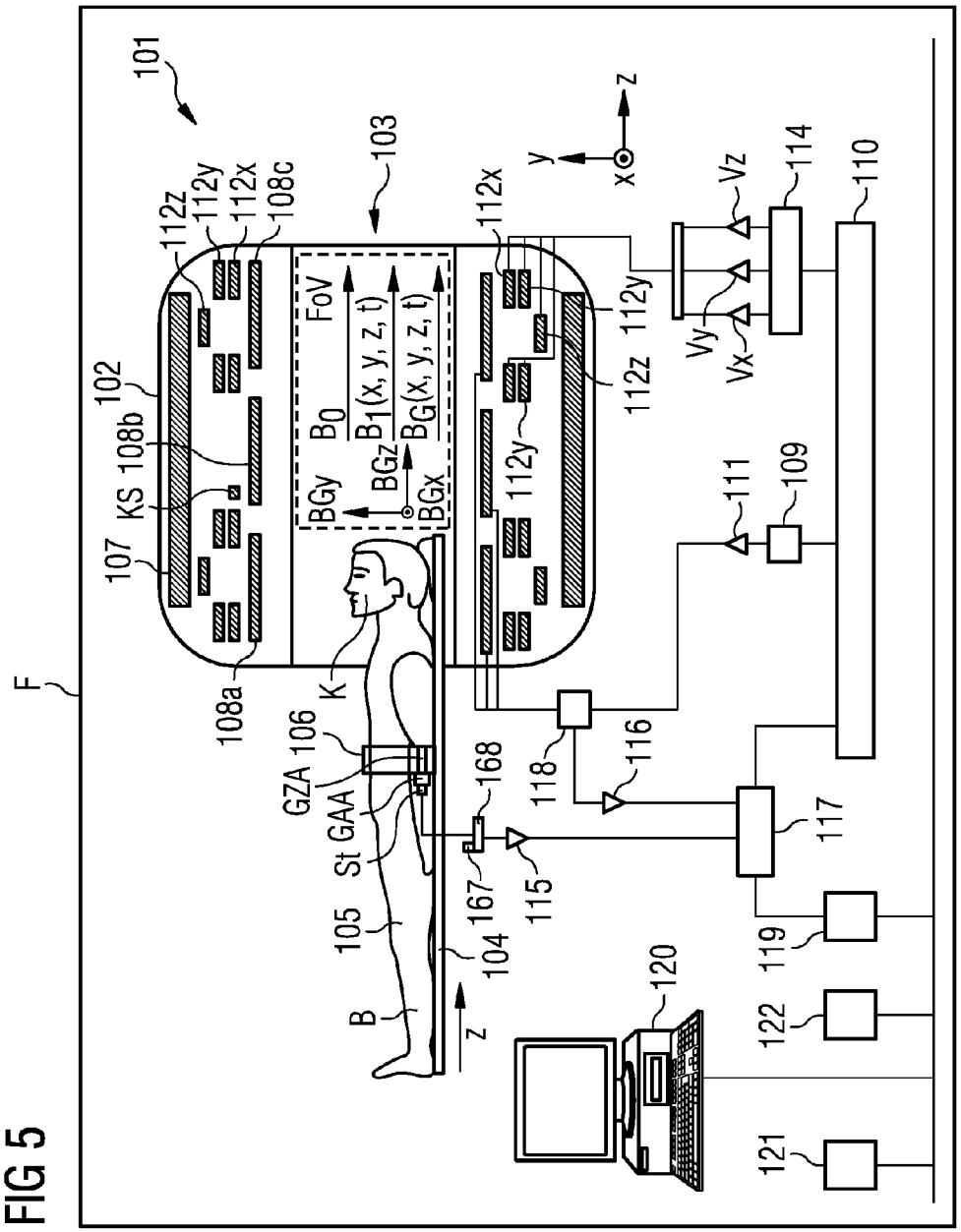

MRT LOCAL COIL

This application claims the benefit of DE 10 2011 079 564.2, filed on Jul. 21, 2011.

BACKGROUND

The present embodiments relate to a local coil for a magnetic resonance tomography (MRT) system.

Magnetic resonance tomography devices for examining objects or patients using magnetic resonance tomography (MRT, MRI) are described, for example, in DE10314215B4.

In MR tomography, images with a high signal-to-noise ratio may be recorded using local coils (e.g., loops). In this way, the excited nuclei induce a voltage into antennas of the local coil. The induced voltage is amplified with a low noise preamplifier (LNA) and is routed via cables to the receiving electronics at the MR frequency. High field systems are also used in high resolution images to improve the signal-to-noise ratio, the basic field strengths of which may lie at 3 Tesla or more. Since more coil elements (loops) may be connected to an MRT receiving system than there are receivers available, a switching matrix (e.g., RCCS) is installed between the receiving antennas and the receiver. This routes the currently active receiving channels to the existing receiver. As a result, more coil elements than there are receivers available may be connected, since with a whole body coverage, only the coils that are in the field of view (FOV) and/or in the homogeneity volume of the magnet are to be read out.

The individual antenna elements are also referred to as coil elements. An antenna that may include one or more coil elements (e.g., array coil) is referred to as a "coil" or "local coil." A local coil includes, for example, coil elements, the preamplifier, further electronics and cabling, the housing and may include a cable with a plug, by which the local coil is connected to the system. "System" below may be the MRT system. "Parallel imaging methods" (e.g., Siemens product name iPAT) are used in MR to reduce the measuring time. These use the spatial resolution of the individual receiving coil elements in order to reduce the measuring time. The greater the number of coil elements on a given geometry, the more rapid acceleration techniques may therefore be used. The motivation in developing high channel local coils (e.g., including many channels) therefore results. The increasing number of channels of local coils also determines (e.g., since the patient geometries remain similar) that the individual coil elements become smaller. Smaller coil elements provide a higher SNR than larger elements in the vicinity of the coil. The increase in the number of channels in a local coil is therefore advantageous in terms of an improved image quality in the vicinity of the receiving antennas and an improved image quality overall during use of iPAT, for example.

In order to be able to evaluate the MR signals emitted by the spin in the examination object, the local coils including a plurality of individual loops (e.g., individual antennas) are used. In this way, each of the individual loops is equipped with evaluation electronics that may occupy between 20 cm$^2$ and 30 cm$^2$ of space. Since the trend in MR diagnostics is moving toward increasingly higher acceleration factors and thus to local coils with ever more channels, the overall dimensions of the local coil do not change or only change insignificantly. An increasingly higher electronics density on the local coils results. Since the electronic components may be embodied as rigid printed circuit boards, the local coils with a higher number of channels are also more inflexible. This is problematic in the case of multipurpose local coils or local coils for abdomen imaging. These should be embodied as flexibly as possible in order to be able to be effectively adjusted to significantly fluctuating anatomies of the examination objects in order thus to achieve the highest possible image quality.

With some flexible local coils, attempts are made to embody the rigid areas of the electronic components to be as small as possible in order to obtain as high a residual flexibility of the local coil as possible. A further known possibility of achieving high coil flexibility is not to connect the electronic components directly to the individual loops (e.g., antennas) but instead in an additional housing that may be placed outside of the examination region. This provides for a very flexible embodiment of the local coil.

SUMMARY

The present embodiments may obviate one or more of the drawbacks or limitations in the related art. For example, a local coil for a magnetic resonance tomography device is further optimized. The coil may be optimized efficiently and ergonomically.

BRIEF DESCRIPTION OF THE DRAWINGS

FIG. 5 shows a schematic and simplified representation of one embodiment of a magnetic resonance tomography system.

DETAILED DESCRIPTION OF THE DRAWINGS

Figure 1:
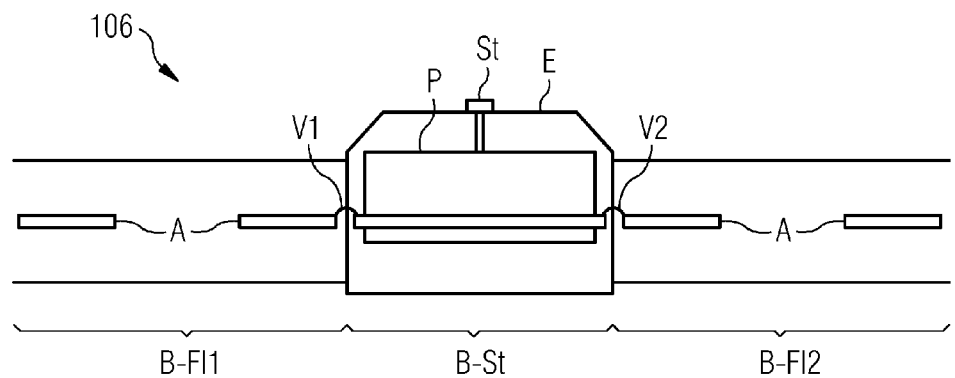
FIG. 1 shows a perspective view of one embodiment of a local coil having rigid antenna support parts with bendable, in an unbent state, straight antenna support parts having several antennas and having an electronics system.

FIG. 5 shows a magnetic imaging resonance device MRT 101 (e.g., located in a shielded room or Faraday cage F) having a whole body coil 102 with a tubular space 103, for example, into which a patient couch 104 with a body 105 (e.g., of an examination object; of a patient; with or without local coil arrangement 106) may be moved in the direction of arrow z in order to generate recordings of the patient 105 using an imaging method. A local coil arrangement 106 (e.g., fastened with the same or a further belt) is arranged, for example, on the patient (e.g., fastened with the belt). Recordings of a subarea of the body 105 may be generated in a field of view (FOV) in a local area of the MRT 101 with the local coil arrangement. Signals of the local coil arrangement 106 may be evaluated, (e.g., converted into images, stored or indicated) by an evaluation device (e.g., including elements 168, 115, 117, 119, 120, 121) of the MRT 101 that may be connected to the local coil arrangement 106 by way of coaxial cables or radio (e.g., element 167).

In order to examine a body 105 (e.g., an examination object or a patient) using a magnetic resonance device MRT 101 for magnetic resonance imaging, different magnetic fields that are attuned as precisely as possible to one another in terms of temporal and spatial characteristics are irradiated onto the body 105. A strong magnet (e.g., a cryomagnet 107) in a measuring cabin with a tunnel-shaped opening 103, for example, generates a strong static main magnetic field $B_0$ that amounts, for example, to 0.2 Tesla to 3 Tesla or more. A body 105 to be examined is moved into an approximately homogenous area of the main magnetic field B0 in the inspection area (e.g., "field of view" (FOV)) when mounted on a patient couch 104. Excitation of the nuclear spin of atomic nuclei of the body 105 takes place by way of high frequency magnetic excitation pulses $B1(x, y, z, t)$ that are irradiated by way of a high frequency antenna (and/or if necessary, a local coil arrangement) that is shown in FIG. 5 in simplified form as a body coil 108 (e.g., a multipart body coil 108a, 108b, 108c). High frequency excitation pulses are generated by a pulse generation unit 109, for instance, that is controlled by a pulse sequence control unit 110. After amplification by a high frequency amplifier 111, the high frequency excitation pulses are routed to the high frequency antenna 108. The high frequency system shown in FIG. 5 is indicated schematically. In some embodiments, more than one pulse generation unit 109, more than one high frequency amplifier 111, and several high frequency antennas 108 a, b, c are used in a magnetic resonance device 101.

The magnetic resonance device 101 has gradient coils 112x, 112y, 112z, with which during a measurement, magnetic gradient fields are irradiated for selective layer excitation and for local encoding of the measuring signal. The gradient coils 112x, 112y, 112z are controlled by a gradient coil control unit 114 that, similarly to the pulse generation unit 109, is connected to the pulse sequence control unit 110.

Signals emitted by the excited nuclear spin (e.g., of the atomic nuclei in the examination object) are received by the body coil 109 and/or at least one local coil arrangement 106, amplified by the assigned high frequency preamplifier 116 and further processed and digitalized by a receiving unit 117. The illustrated measuring data is digitalized and stored as complex numerical values in a k-space matrix. An associated MR image may be reconstructed from the k-space matrix populated by values using a multidimensional Fourier transformation.

For a coil that may be operated both in the transmit and also in the receive mode (e.g., the body coil 108 or a local coil 106), the correct signal forwarding is controlled by an upstream transmit-receive switch 118.

An image processing unit 119 generates an image from the measuring data. The image is shown to a user by way of an operation panel 120 and/or is stored in a storage unit 121. A central computing unit 122 controls the individual system components.

In MR tomography, images with a high signal-to-noise ratio (SNR) may be recorded using local coil arrangements (e.g., coils, local coils). The local coil arrangements are antenna systems that are attached in the direct vicinity of (anterior), below (posterior), on or in the body 105. With an MR measurement, the excited nuclei induce a voltage into the individual antennas of the local coil. The induced voltage is amplified with a low noise preamplifier (e.g., LNA, Preamp) and is forwarded to the receiving electronics. In order to improve the signal-to-noise ratio in high resolution images too, high field systems are used (e.g., 1.5 T and more). If more individual antennas may be connected to an MR receiving system than there are receivers available, a switching matrix (e.g., RCCS) is integrated between the receiving antennas and the receiver, for example. This routes the currently active receiving channels (e.g., the channels that lie precisely in the FOV of the magnet) to the available receiver. As a result, more coil elements than there are receivers available may be connected, since with whole body coverage, only the coils that are in the FOV and/or in the homogeneity volume of the magnet are to be read out.

An antenna system may be referred to as a local coil arrangement 106, for example, that may include, for example, one antenna element or an array coil including several antenna elements (e.g., coil elements). The individual antenna elements are embodied, for example, as loop antennas (e.g., loops), butterfly, flexible coils or saddle coils. A local coil arrangement includes, for example, coil elements, a preamplifier, further electronics (e.g., shetah current filters), a housing, bearing surfaces and may include a cable with a plug, by which the local coil arrangement is connected to the MRT system. A receiver 168 attached on the system side filters and digitizes a signal received by a local coil 106, for example, by radio and transfers the data to a digital signal processing device that may derive an image or a spectrum from the data obtained by a measurement. The digital signal processing device makes the image or the spectrum available to the user, for example, for subsequent diagnosis thereby or storage.

Exemplary embodiments of MRT local coils 106 are described below in more detail with the aid of FIG. 1-4.

A patient 105 lying on a patient couch 104 is to be examined in an MRT 101 using a local coil 106 resting on the patient 105 (e.g., on the abdomen of the patient 105).

Figure 3:
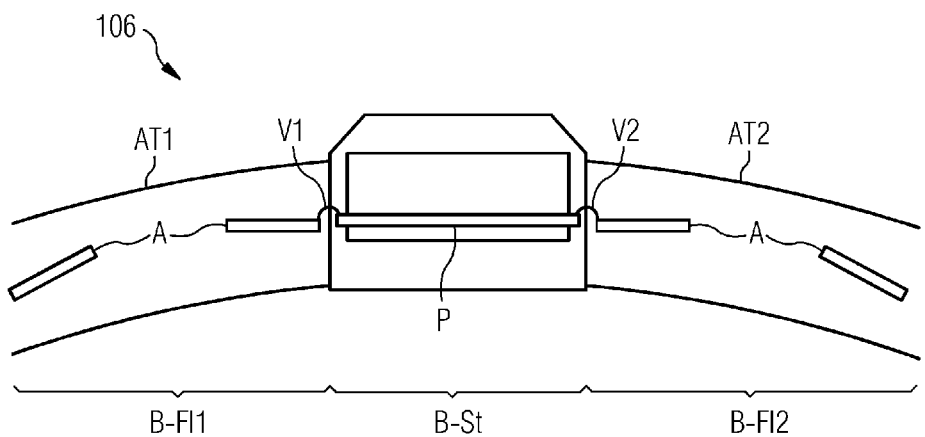
FIG. 3 shows a perspective representation of one embodiment of a local coil with rigid antenna support parts having bendable, in an unbent state, arched antenna support parts having several antennas and an electronics system.
Figure 4:
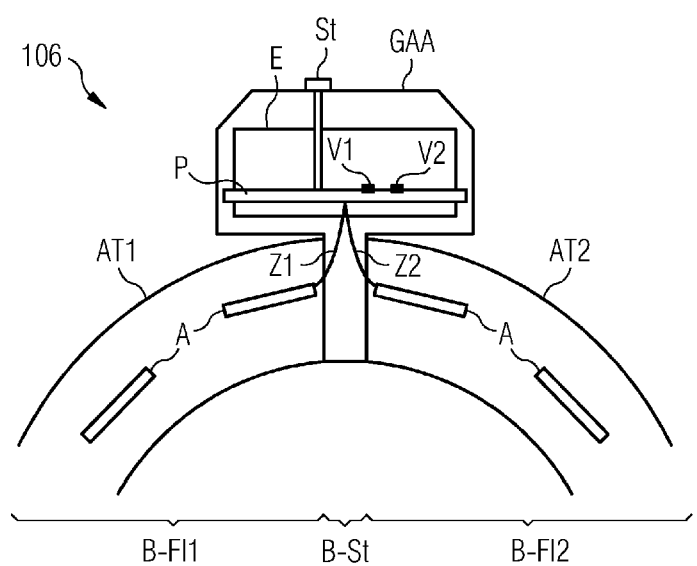
FIG. 4 shows a perspective view of one embodiment of a local coil with bendable, in an unbent state, arched antenna support parts having several antennas and an electronics system with electronic components laterally outside of the antenna support parts.

FIG. 1 shows an abdominal local coil 106 for a magnetic resonance tomography device 101 having an elastic two-part antenna support part AT1, AT2 (e.g., in elastic flexible areas B-FL-1 and B-FL2) with several antennas A therein respectively and having an electronic part E (e.g., in a non-elastic, inflexible, stiff area B-St) with electronic components connected to the antennas A via supply lines Z1, Z2 (e.g., preamplifiers V1, V2 on a printed circuit board P). FIG. 3 shows a curved abdominal local coil 106.

Figure 2:
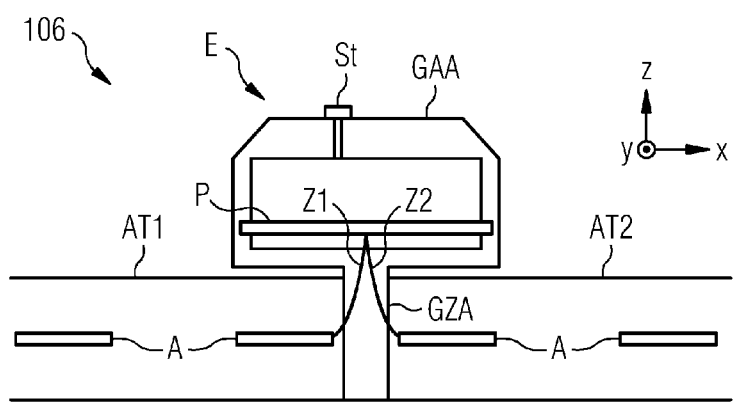
FIG. 2 shows a perspective view of one embodiment of a local coil having bendable, in an unbent state, straight antenna support parts having several antennas and having an electronics system with electronic components laterally outside of the antenna support parts.

FIG. 2 shows an abdominal local coil 106 for a magnetic resonance tomography device 101 having an elastic two part antenna support part AT1, AT2 (e.g., in elastic flexible areas B-FLK-1 and B-FL2) with several antennas A in each case, and an electronic part E (e.g., in a non-elastic, inflexible rigid area B-ST) having electronic components connected to the antennas A via supply lines Z1, Z2 (e.g., preamplifiers V1, V2 on a printed circuit board P and a terminal St, in which components 168, 117, 110 of the MRT 101 may be connected via cables in order to evaluate the image data and/or control the local coil 106).

Electronic components such as preamplifiers V1, V2 of the electronic part E of the local coil 106 are in the z-direction outside of and/or laterally outside of the antenna support part AT1, AT2 of the local coil. As a result, the rigid area B-St of the local coil may be embodied narrower than in FIG. 1, and the local coil 106 is flexible/bendable in a larger area B-FL-1+B-FL2.

The electronic part E includes a multipart housing GAA, GZA. A housing outer segment GAA is disposed completely in one direction z lateral to the multipart antenna support part AT1, AT2, and a housing intermediate segment GZA is disposed on or between segments AT1, AT2 of the antenna support part (e.g., on one of the planar sides (facing away in the figure in direction+y) of the antenna support part AT1, AT2).

The housing of the electronic part E includes an elongated part GZA and a planar GAA part when viewed cross-sectionally. Lines Z1, Z2 run from the antenna A to the electronic part E in the elongated part and/or housing intermediate segment GZA of the housing. Elements such as an amplifier V1, V2 and/or electronic part E are located in the planar part and/or housing outer segment GAA of the housing when viewed cross-sectionally.

In other words, the housing GZA, GAA of the electronic part E has a mushroom-type cross-section. In the style of the mushroom or housing intermediate segment of the housing, a connection of the antenna and/or lines of the antenna to the electronic part are located. The electronic part is in the mushroom head of the mushroom or housing outer segment of the housing.

In one embodiment, electronic components V1, V2 of the local coil 106 are located laterally in the electronic part E (as in GAA) of the antenna support part, whereas no electronic components V1, V2 of the local coil 106 are located in and/or on the antenna support part AT1, AT2 in order to enable high elasticity and/or flexibility of the antenna support part AT1, AT2.

The electronic part E of the local coil (e.g., the part of the local coil, in which the electronic system of the coil is located) has, for example, one or more printed circuit board(s) P, on which electronic components V1, V2 of the local coil 106 and/or a terminal St (e.g., for connecting the local coil to an MRT by way of a patient couch) are disposed.

In the exemplary embodiment in FIG. 2, the antenna support part AT1, AT2 and antenna A run therein in an unstressed and/or unbent state. In the exemplary embodiment according to FIG. 4, the antenna support part AT1, AT2 and antenna A run therein in an arched (e.g., not straight) unstressed and/or unbent state.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomography device, the local coil comprising:
   an antenna support part having antennas;
   an electronic part with electronic components connected to the antennas by way of supply lines,
   wherein at least one part of the electronic part is located outside of the antenna support part,
   wherein the electronic part comprises a housing, the housing having an elongated part and a planar part when viewed in the cross-section,
   wherein in the elongated part, a housing intermediate segment, or the elongated part and the housing intermediate segment of the housing, there is a connection located between the antennas, lines, or the antenna and the lines of the antennas to the electronic part, and
   wherein when viewed cross-sectionally, elements of the electronic part are located in the planar part, a housing outer segment, or the planar part and the housing outer segment of the housing.

2. The local coil as claimed in claim 1, wherein all or part of the electronic components of the electronic part are outside of, laterally outside of, or outside of and laterally outside of the antenna support part.

3. The local coil as claimed in claim 1, wherein all or at least part of the electronic components of the electronic part are located in a direction lateral to an extension of the antenna support part, in which the electronic part is longest.

4. The local coil as claimed in claim 1, wherein the antennas are arranged in series one behind the other in at least one direction.

5. The local coil as claimed in claim 1, wherein the antennas comprise elongated, rod-type, or elongated and rod-type antennas arranged spatially in series relative to one another.

6. The local coil as claimed in claim 1, wherein the local coil is an abdomen local coil.

7. The local coil as claimed in claim 1, wherein the local coil is a mechanically flexible local coil.

8. The local coil as claimed in claim 1, wherein the housing outer segment of the housing is located completely in a direction lateral to the antenna support part.

9. The local coil as claimed in claim 1, wherein the housing intermediate segment of the housing is located in the antenna support part between segments of the antenna support part.

10. The local coil as claimed in claim 1, wherein the housing intermediate segment of the housing is arranged on the antenna support part on a side vertical to a side of the antenna support part, on which the electronic part is arranged.

11. The local coil as claimed in claim 10, wherein the intermediate segment of the housing is arranged on the antenna support part on one planar side of the antenna support part.

12. The local coil as claimed in claim 1, wherein the electronic components of the local coil are only located in the electronic part,
   wherein no electronic components of the local coil are located in, on, or in and on the antenna support part.

13. The local coil as claimed in claim 1, wherein the electronic part comprises at least one printed circuit board, on which the electronic components, a terminal, or the electronic components and the terminal are disposed.

14. The local coil as claimed in claim 1, wherein the supply lines from the antennas to the electronic components are only located in the antenna support part, in a plane of the antenna support part, or in the antenna support part and in the plane of the antenna support part, and
   wherein all the electronic components are located outside of the antenna support part.

15. The local coil as claimed in claim 1, wherein the antenna support part, the antennas, or the antenna support part and the antennas run in an arched manner.

16. The local coil as claimed in claim 15, wherein the antenna support part, the antennas, or the antenna support part and the antennas run in the arched manner in an unstressed state, an unbent state, or the unstressed and the unbent state.

17. The local coil as claimed in claim 1, wherein the antenna support part, the antennas, or the antenna support part and the antennas run unarched in an unstressed state, an unbent state, or the unstressed and the unbent state.

18. The local coil as claimed in claim 1, wherein at least some of the electronic components of the electronic part are preamplifiers.

19. The local coil as claimed in claim 18, wherein the preamplifiers are operable for amplifying the antennas connected to one or several of the preamplifiers from magnetic resonance signals that are receivable by a body prior to forwarding to an imaging evaluation device of the magnetic resonance tomography device.

20. The local coil as claimed in claim 1, wherein the electronic part has a terminal for connection of the local coil via cables to a control device, evaluation device, or the control device and the evaluation device of the magnetic resonance tomography device.

21. The local coil as claimed in claim 1, wherein the antennas are only outside of the housing of the electronic part.

22. The local coil as claimed in claim 1, further comprising a bendable area, in which the antennas are embedded.

23. The local coil as claimed in claim 1, wherein a supply line part of the electronic part is in or on the antenna support part.

24. The local coil as claimed in claim 1, wherein the antenna support part has two segments between which a part of the electronic part is located.

25. The local coil as claimed in claim 24, wherein the part of the electronic part is without antennas.

26. A local coil for a magnetic resonance tomography device, the local coil comprising:
   an antenna support part having antennas;
   an electronic part with electronic components connected to the antennas by way of supply lines,
   wherein at least one part of the electronic part is located outside of the antenna support part,
   wherein the electronic part comprises a housing, the housing having a mushroom-type cross-section,
   wherein a connection of the antennas or lines of the antennas to the electronic part is located in a stalk of the mushroom or an intermediate segment of the housing, and
   wherein the electronic part is located in a mushroom head of the mushroom or an outer segment of the housing.

27. A local coil for a magnetic resonance tomography device, the local coil comprising:
   an antenna support part having antennas;
   an electronic part with electronic components connected to the antennas by way of supply lines,
   wherein at least one part of the electronic part is located outside of the antenna support part,
   wherein the antenna support part has at the most a third, a fourth, or a fifth of the smallest diameter of a housing outer segment of the electronic part of the local coil.

\* \* \* \* \*